United States Patent [19]

Kraus

[11] 4,217,856
[45] Aug. 19, 1980

[54] VACUUM EVAPORATION APPARATUS

[75] Inventor: Thaddäus Kraus, Triesen, Liechtenstein

[73] Assignee: Balzers Aktiengesellschaft für Hochvakuumtechnik und Dünne Schichten, Liechtenstein

[21] Appl. No.: 919,546

[22] Filed: Jun. 27, 1978

[30] Foreign Application Priority Data

Jul. 8, 1977 [CH] Switzerland .................. 008475/77

[51] Int. Cl.² .............................................. C23C 13/08
[52] U.S. Cl. ................................... 118/724; 118/726; 427/248.1
[58] Field of Search ..................... 118/48–49.5, 118/724, 726; 126/39 M; 427/255, 250; 219/1 NQ; 98/1 NQ

[56] References Cited

U.S. PATENT DOCUMENTS

| | | | |
|---|---|---|---|
| 2,440,135 | 4/1948 | Alexander | 118/49 X |
| 2,445,310 | 7/1948 | Chilowsky | 118/49 X |
| 2,469,929 | 5/1949 | Osterberg et al. | 118/49 X |
| 2,793,609 | 5/1957 | Shen et al. | 118/726 |
| 2,938,816 | 5/1960 | Gunther | 118/49 X |
| 3,070,879 | 1/1963 | Seale | 126/39 M X |
| 3,325,628 | 6/1967 | Valley et al. | 118/726 |
| 3,344,768 | 10/1967 | Jennings | 118/48 |
| 3,396,696 | 8/1968 | Becker | 118/49 |
| 3,571,478 | 3/1971 | Teagan | 118/49 X |
| 3,617,348 | 11/1971 | Kelley et al. | 118/49 X |
| 3,649,339 | 3/1972 | Smith | 118/49 X |
| 3,800,738 | 4/1974 | Tassara | 118/49 X |
| 4,046,101 | 9/1977 | Winkler | 118/726 |

FOREIGN PATENT DOCUMENTS 1565420 3/1972 Fed. Rep. of Germany.

*Primary Examiner*—Ralph S. Kendall
*Attorney, Agent, or Firm*—McGlew and Tuttle

[57] ABSTRACT

The vacuum evaporation apparatus comprises a housing having walls defining an evacuable evaporation chamber with an evaporator in the chamber disposed below a supporting structure for the substance to be coated and including an annular screen disposed around the evaporator between the evaporator and the walls of the housing so that only an opening or angle between the evaporator and the supporting structure is left which is sufficient for the vapor deposition of the substrates. The screen is of a material which may be heated, such as a metal material, which may be electrically heated.

7 Claims, 3 Drawing Figures

VACUUM EVAPORATION APPARATUS

FIELD AND BACKGROUND OF THE INVENTION

This invention relates in general to an apparatus for the vacuum evaporation of a substance for the deposition of the substance on a substrate and, in particular, to a new and useful vacuum evaporation apparatus which includes an evaporator spaced away from a support for the substance to be evaporated which is surrounded by a screen which may be heated.

DESCRIPTION OF THE PRIOR ART

Within the range of high vacuum, the pressure during the evacuation of an evaporation chamber may be expressed approximatively by a fractional rational function of the suction speed of the pumping system, as well as by exponential functions of the amount of vapor, primarily water vapor, which has been sorbed by the inside walls of the evaporation chamber during the preceding contact with vapor-containing air and which is slowly released again in the high vacuum, and of the temperature. Because of the stronger increase of the two mentioned exponential functions, the heating of the inside walls during evacuation offers great advantages over isothermal evacuation processes. That is, the desorption of the vapor increases with the temperature so strongly that upon a drop in temperature, a much lower vapor pressure is obtained than with an isothermal desorption.

SUMMARY OF THE INVENTION

The invention is directed to a vacuum evaporation apparatus in which, during the evacuation thereof, the inside walls limiting the evaporation space can first be heated to cause desorption and then cooled down and maintained at a low temperature in order to obtain a quick pressure drop.

Even though means for heating and cooling the walls of evaporation apparatus are well known, their effectiveness in preventing the desorption during vapor deposition is unsatisfactory, because the walls are heated by the thermal radiation of the evaporator. Screening means for intercepting the distrubing radiation of heat have already been proposed. However, this again did not result in the prevention of an undesirable increase in desorption during the vapor deposition, since, in consequence, the screens themselves now produced the effect of sorbing and desorbing surfaces. In any event, in order to eliminate this drawback, expensive means for obtaining an intense cooling of the screens would be necessary.

Thus, the undesirably increased desorption during the vapor deposition could not be prevented by the provision of separate arrangements including, on the one hand, heat radiation sources for the heating and, on the other hand, cooled screening means against distrubing radiation.

Accordingly, an object of the invention is to provide a vacuum evaporation apparatus which comprises a housing having walls which define an evacuable evaporation chamber with an evaporator accommodated therein arranged below a supporting structure for the substrates to be coated and which includes an annular screen disposed around the evaporator between the evaporator and the walls of the housing leaving an aperture from the evaporator to the substrate which is sufficient for the vapor deposition on the substrates and, wherein, the screen is made of a material which may be heated.

A further object of the invention is to provide a vacuum evaporation apparatus which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
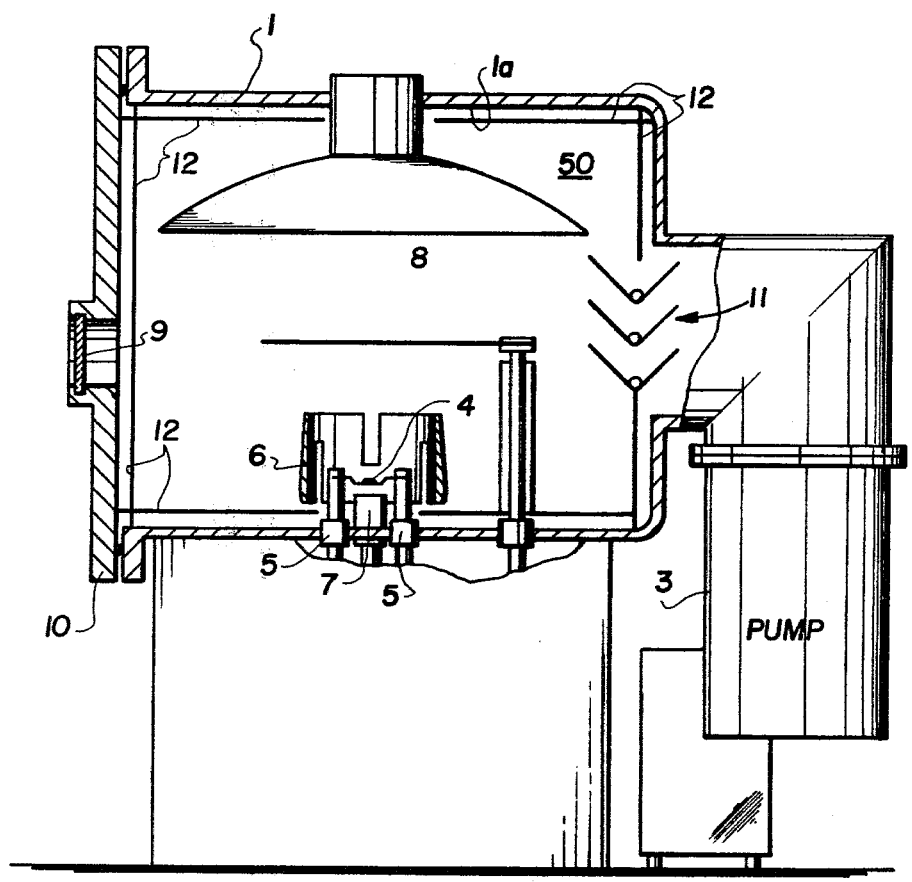
FIG. 1 is a partial elevational and partial sectional view of an evacuation apparatus constructed in accordance with the invention.

Referring to the drawings in particular, the invention embodied therein in FIG. 1, comprises, an evaporation chamber housing 1, which has walls defining an interior evacuation chamber 50, which has a protective coating of a thin foil material 12 arranged at spaced locations from interior walls 1a. The evacuable evaporation chamber 50 is connected through a suction connection 2 to a pump 3. The evaporation chamber accommodates an electrical evaporator 4 for the evaporative coating material, which is supplied with heating current through vacuum-tight lead-ins 5.

In accordance with the invention, the evaporator is surrounded, additionally, by an annular screen 6 which is itself heatable. For example, this screen may comprise an electrically heatable, cylindrical carbon heating body, such as described in German Pat. No. 1,565,420, which is supported by current supply structural elements 7, 7 and supplied with heating current. (See FIG. 1, in which only one of the structural elements 7 is visible.)

FIG. 1 further illustrates a rotatable spherical cap 8 which serves as a support for the substrates, a door 10 of the evaporation chamber provided with an inspection glass 9 and a radiation screen 11 in front of the suction opening.

As the described apparatus is opened and vapor-containing air has access to the inside walls, these walls sorb a certain amount of vapor. Upon closing the apparatus for desorption, the inside walls are heated by heating the screen 6 and the desorbed vapor is pumped out. As soon as a certain vacuum is reached, the heating of the screen 6 is switched off, so that the no longer heated inside walls of the evaporation chamber cool down and the pressure drops quickly. During the following vapor deposition, the inside walls are shielded from the thermal radiation of the evaporator by the screen, which is now cool. The heretofore unavoidable reheating of these walls and, consequently, further gas release by desorption are thereby prevented.

This advantage of the invention takes effect particularly in evaporation chambers in which the inside walls are masked by a thin-walled covering 12 and, during a contact with air, a protective gas is introduced into the intermediate space between the wall of the container and the covering. This method and an evaporation chamber provided with such a masking have been disclosed in a preceding application Ser. No. 903,173 of May 5, 1978. In FIG. 1 of the present application, the covering or masking is indicated at 12. In such evaporation apparatus, the temperature of the masking can be changed very quickly, whereby, the time needed for an evacuation and vapor-deposition cycle is substantially reduced.

The thinner the masking sheets, the quicker the temperature can be changed, and the greater the time gain to attain the required low pressure. The disadvantage of this design, however, was that such thin masking sheets are particularly easily reheated by the radiation sources which are inevitable during the vapor deposition, and cause an uncontrollable desorption increase by which the reproducibility of the vapor-deposited layers is affected. The present invention eliminates this drawback even in such masked containers.

Figure 3:
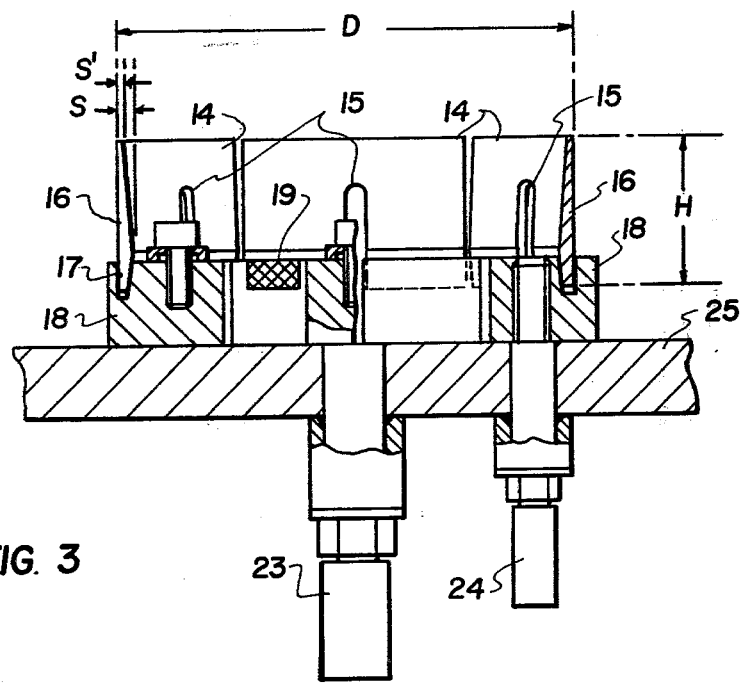
FIG. 3 is a section taken along the line 3—3 of FIG. 2.
Figure 2:
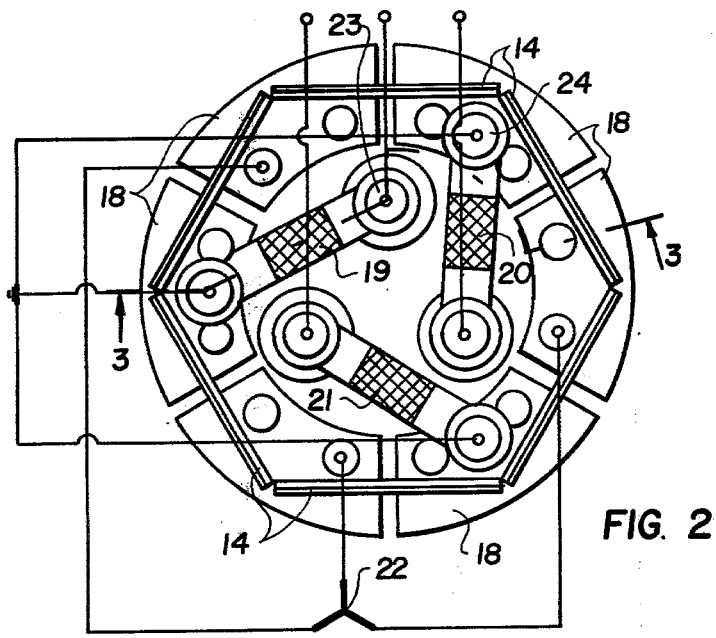
FIG. 2 is a top plan view of another emboidment of the invention showing evacuation apparatus with the cover of the housing removed.

A particularly advantageous embodiment of the invention is shown in FIGS. 2 and 3. A heatable screen, according to FIGS. 2 and 3, comprises a plurality of plane plates 14 having deep recesses 15 between their wedge-shaped fixing ends 16, which are arranged so as to form the surface shell of a hexagonal prism or of a truncated pyramid. The fixing is done by inserting (driving) the wedge-shaped fixing ends 16 into wedge-shaped grooves 17 provided in current-supply segments 18. The taper of the wedge is proportioned so as to facilitate the driving out of the heating plates, for example, 1:10. The advantages of this design are low manufacturing costs and the ease in exchanging the heating plates. The plates which taper upwardly are of particular advantage. For particulars thereof, see German Pat. No. 1,565.420.

A satisfactory quick cooling of the screen is obtained by providing plates of a small height, low density and specific heat, and which have a high thermal conductivity. Sutiable material properties are found in graphites. For example, for an evaporation chamber with a diameter and height of 600 mm, a suitable screen would be a tubular heating conductor of graphite having a diameter $D=100$ mm, a height $H=50$ mm, and a wall thickness $S=6$ mm tapering upwardly to $S\alpha =2$ mm.

The advantage of a screen assembled of heating plates is primarily the low manufacturing costs as compared to cylindrical heating bodies which is of importance particularly if larger dimensions are to be considered. FIGS. 2 and 3 show the possibility of accommodating three evaporators 19, 20 and 21 in the interior of the screen formed of plates 14, in which instance, the screen may advantageously be heated by a three-phase current. Connections for a three-phase current are indicated in FIG. 2 at 22.

FIG. 3 further shows a current-supply lead-in 23 for evaporator 19, and a similar lead-in 24 for the electrical heating of the screen, both extending through the baseplate 25 of the container.

It is advisable to provide a cooling of the heatable screen, or at least of the lead-ins thereof, in order to obtain a shorter cooling time after the heating is switched off. This also facilitates the dissipation of the heat transferred to the screen by radiation from the evaporator. For cooling, the screen may be connected to a cooling body in a heat-conducting manner. For this purpose, a bottom plate of aluminum may be provided which is coated with an alumina layer (anodized). This layer is electrically insulating, but does not prevent the conduction of heat.

While specific embodiments of the invention have been shown and described in detail to illustrate the application of the principles of the invention, it will be understood that the invention may be embodied otherwise without departing from such principles.

I claim:

1. A vacuum evaporation apparatus, comprising, a housing having walls defining an evacuable evaporation chamber, an evaporator disposed in said housing which is heatable to evaporate a substance thereon, a supporting structure disposed in said housing in said chamber overlying said evaporator for supporting substrates to be coated, and a screen heatable independently of said evaporator and capable of heating the walls of said housing and disposed around said evaporator between said evaporator and the walls of said housing, said screen defining a limiting aperture between said evaporator and said supportive structure limiting radiation to an angle of a size sufficient only for the vapor deposition on the substrate.

2. A vacuum evaporation apparatus, as claimed in claim 1, wherein said screen is closer to said evaporator than the walls of said housing.

3. A vacuum evaporation apparatus, as claimed in claim 1, including a protective foil wall disposed in said housing in spaced relationship to the interior walls of said housing forming a covering masking the walls of said housing.

4. A vacuum evaporation apparatus, as claimed in claim 1, wherein said screen comprises an electrical heater and means connected to said screen for supplying current thereto for heating said screen.

5. A vacuum evaporation apparatus, as claimed in claim 1, wherein said screen comprises a plurality of plate elements forming a polygon around said evaporator.

6. A vacuum evaporation apparatus, as claimed in claim 5, wherein said evaporator includes a plurality of evaporators arranged within said screen, said screen comprising a hexagonal structure formed of a plurality of plates, said evaporator housing including a mounting base having wedge-shaped receiving grooves, said plates being of wedge-shaped construction and being engaged in respective heating grooves.

7. A vacuum evaporation apparatus, as claimed in claim 1, including a cooling body disposed adjacent said screen and connected to said screen for dissipating the heat of said screen.

* * * * *